United States Patent
Frosien et al.

(10) Patent No.: US 8,158,939 B2
(45) Date of Patent: Apr. 17, 2012

(54) HIGH RESOLUTION GAS FIELD ION COLUMN

(75) Inventors: Juergen Frosien, Riemerling (DE); Dieter Winkler, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 122 days.

(21) Appl. No.: 12/691,932

(22) Filed: Jan. 22, 2010

(65) Prior Publication Data

US 2010/0187436 A1  Jul. 29, 2010

(30) Foreign Application Priority Data

Jan. 23, 2009 (EP) ..................... 09151265

(51) Int. Cl.
*H01J 37/05* (2006.01)
*H01J 37/28* (2006.01)
*H01J 37/285* (2006.01)

(52) U.S. Cl. .... 250/309; 250/305; 250/307; 250/492.21
(58) Field of Classification Search .................. 250/305, 250/309, 307, 492.21, 492.3
See application file for complete search history.

(56) References Cited

U.S. PATENT DOCUMENTS

| | | | |
|---|---|---|---|
| 6,410,924 B1 * | 6/2002 | Wang | 250/398 |
| 2007/0138388 A1 * | 6/2007 | Ward et al. | 250/288 |
| 2010/0327180 A1 * | 12/2010 | Schwind et al. | 250/396 R |

FOREIGN PATENT DOCUMENTS

| | | |
|---|---|---|
| EP | 01860679 A1 | 11/2007 |
| WO | WO2007/067317 A2 | 6/2007 |

OTHER PUBLICATIONS

Kuo et al., "Noble Metal/W(111) Single-Atom Tips and Their Field Electron and Ion Emission Characteristics", Japanese Journal of Applied Physics, vol. 45, No. 11, 2006, pp. 8972-8983.*
T. Itakura, et al., "Microprobe of Helium Ions," J. Vac. Sci. Technol. B 9 (5) Sep./Oct. 1991, pp. 2596-2601, Fujitsu Laboratories, Ltd., Atsugi, Japan.
EESR, EP 09151265.7, Jul. 27, 2009.

* cited by examiner

*Primary Examiner* — Jack Berman
(74) *Attorney, Agent, or Firm* — Patterson & Sheridan, L.L.P.

(57) ABSTRACT

An ion beam apparatus and a method for providing an energy-filtered primary ion beam are described. Therein, a primary ion beam having an asymmetric first energy distribution is generated by means of an ion source. The primary ion beam is energy filtered using, for example, a retarding lens.

25 Claims, 4 Drawing Sheets

HIGH RESOLUTION GAS FIELD ION COLUMN

FIELD OF THE INVENTION

The invention generally relates to an ion beam apparatus, e.g. for inspection applications, testing applications, lithography applications and the like. More particularly, it relates to a gas field ion source ion beam apparatus. The invention further relates to a method for providing a primary ion beam emitted from a gas field ion source.

BACKGROUND OF THE INVENTION

Charged particle beam apparatuses have many functions in a plurality of industrial fields, in particular in fields having a high demand for structuring and inspecting specimens within the micrometer and nanometer scale. Typical applications of charged particle beam apparatuses include inspection of semiconductor apparatuses during manufacturing, exposure systems for lithography, detecting apparatuses and testing systems. Charged particle beams offer superior spatial resolution compared to e.g. photon beams, due to their short wavelengths.

An important factor limiting the spatial resolution of charged particle beam apparatuses is the chromatic aberration of the charged particle optical system. The chromatic aberration can be reduced, e.g., by reducing the energy spread of the charged particle beam. To reduce the energy spread, very expensive and complicated monochromators have been designed. These monochromators have the further disadvantage of reducing the beam intensity considerably.

Beyond that, a promising candidate for further improvement of charged particle beam apparatuses are charged particle beam apparatuses including a gas field ion source. Thereby, a very high resolution is aimed to be achieved due to their high brightness, small diffraction and small energy width. Experiments have shown that an energy width of <0.5 eV can be achieved for gas field ion sources having an unperturbed monocrystalline structure. Additionally, the use of a superimposed tip structure for further increasing the source brightness and further reducing the virtual source size have recently been proposed.

However, it has been found that the excellent energy width of the ion beam emitted from a gas field ion source, as described above, is deteriorated when using superimposed tip protrusions. Additionally or alternatively, the existence of different mechanisms of ionization and/or scattering might influence the energy width of the ion beam emitted by a gas field ion source. The increase in energy width can destroy the good resolution, which correlates to the energy width, as described above.

Surprisingly, it has been found that a reduction of an energy width of an ion beam is desired for gas field ion sources which are commonly known for their excellent energy width.

SUMMARY OF THE INVENTION

In light of the above, the present invention intends to provide an improved charged particle beam apparatus, and an improved method for providing an energy-filtered primary ion beam emitted from a gas field ion source.

According to embodiments of the present invention a method for providing an energy-filtered primary ion beam according to independent claim 1, and an ion beam apparatus according to independent claim 11 are provided.

Further advantages, features, aspects and details that can be combined with the above embodiments to yield yet further embodiments are evident from the dependent claims, the description and the drawings.

According to one embodiment, a method for providing an energy-filtered primary ion beam is provided. The method includes generating a primary ion beam having an asymmetric first energy distribution, wherein the primary ion beam is generated by means of a gas field ion source; and energy filtering the primary ion beam for reducing the energy width of the primary ion beam.

According to another embodiment, an ion beam apparatus is provided. The ion beam apparatus includes a gas field ion source for providing a primary ion beam, and an energy filter adapted for reducing the energy width of the primary ion beam.

Embodiments are also directed to apparatuses for carrying out the disclosed methods and include apparatus parts for performing each described method step. Furthermore, embodiments are also directed to methods by which the described apparatuses operate. It includes method steps for carrying out every function of the apparatuses or manufacturing every part of the apparatuses. The method steps may be performed by way of hardware components, a computer programmed by appropriate software, by any combination of the two or in any other manner.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE DRAWINGS

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following description the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

The good characteristics, which are generally known to be provided for gas field ion sources, can be theoretically be verified for infinite crystals. In practice, these properties have been shown for crystal sizes having an emission area of about 300 nm. However, the use of superimposed emitter tips, which are sharp on an atomic scale and which may have a tip size of about 3 nm show a broadening of the energy width of the emitted beam. Accordingly, an energy width of about 2-4 eV can be found, which limits the resolution of the system.

Figure 1:
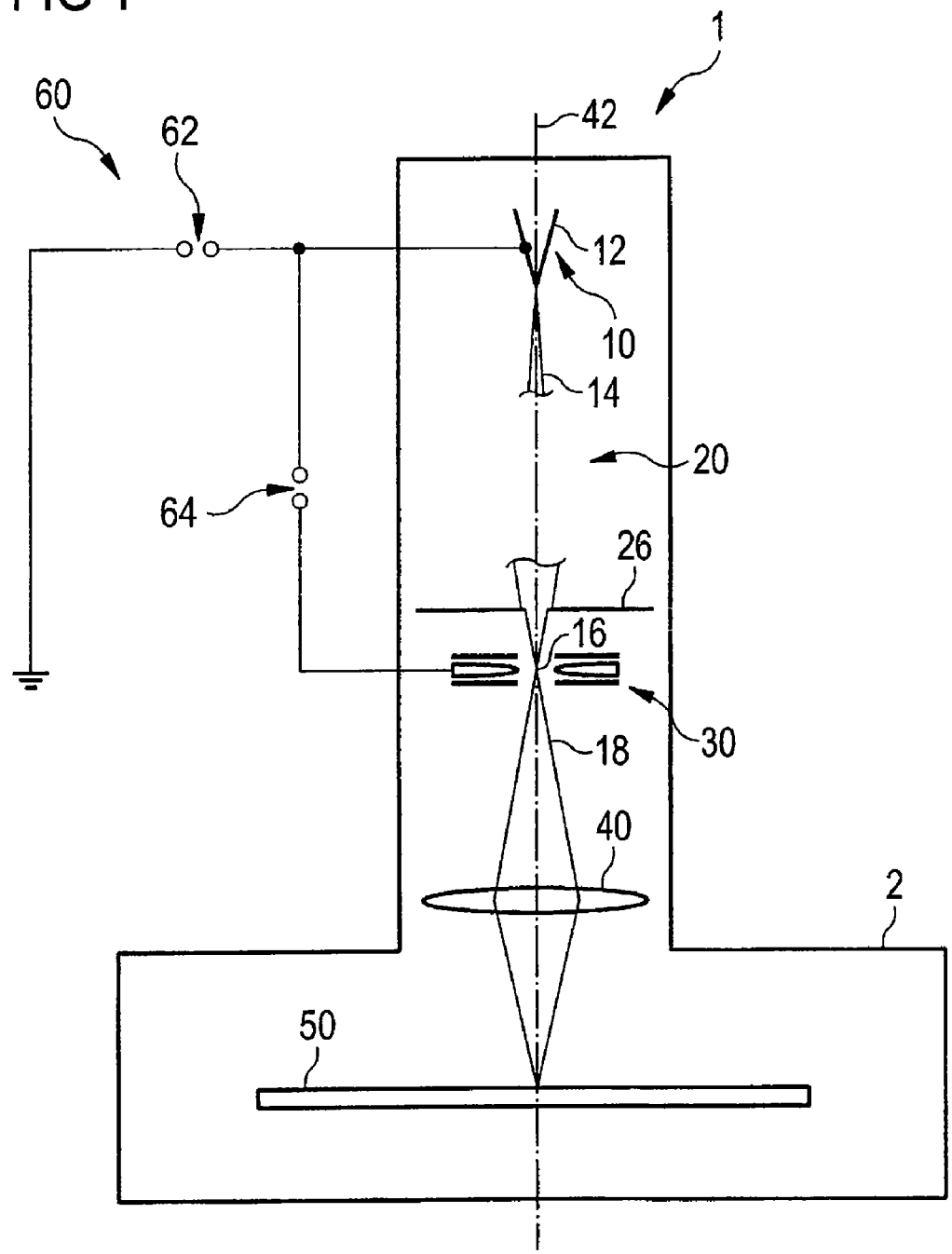
FIG. 1 shows a schematic view of parts of a first embodiment of an ion beam apparatus.

FIG. 1 shows a schematic view of parts of a first embodiment of an ion beam apparatus 1 according to the present invention. The ion beam apparatus 1 may be used for inspection or lithography, and may specifically be a scanning ion microscope, more specifically a low voltage scanning ion microscope. It includes a housing 2, a primary ion beam source 10, beam-shaping means 20, a retarding lens 30, an objective lens 40, a holder for a specimen 50, and a control system 60.

The primary ion beam source 10 includes a gas field emitter tip 12 for emitting a primary ion beam 14 along an optical axis 42 of the apparatus. The gas field ion source 10 may include a tip, such as a single atom ultra sharp tip or a superimposed tip.

According to embodiments described herein, the emitter 10 includes an emitter base tip and an emitter superimposed tip. The ion beam is emitted from the emitter tip having an ultra sharp tip or an superimposed tip. The emitter base tip can include a material that is different from the material of the superimposed tip. According to embodiments described herein, the tip has one single atom at its end. According to some embodiments described herein, which can be combined with other embodiments described herein, the base tip can be a single crystal base tip. Examples of an emitter having an ultra sharp tip or a superimposed tip are described in European Application, Appl. No. 08156665, which has been filed on May 21, 2008, entitled "Ultra high precision measurement tool" which is incorporated herein by reference to the extent the applications are not inconsistent with this disclosure.

According to yet other embodiments, a method of preparing an ultra sharp tip, in particular a single atom tip, can include providing a tip having a shank, an apex, and a coating covering the shank and the apex; locally removing the coating from the apex by field evaporation; and partially or fully restoring the coating at the apex. Thereby, a simplification may be achieved using standard equipment and/or standard base tips in the initial step of providing a covered base tip. Further, the subsequent preparation steps of field evaporation and restoring of the coating at the apex can be done in one vacuum setup, which, in addition, may be provided separately from the equipment used for the initial step of providing a covered base tip. In addition, the steps of field evaporation and restoring of the coating at the apex may be performed in situ, typically in a vacuum setup and/or at a tip position which are used for a later application of the ultra sharp tip, e.g. in a charged particle column. For instance, the steps of field evaporation and restoring of the coating at the apex may be performed directly in a charged particle beam column in which imaging processes using the ultra sharp tip are performed, e.g. probing and/or structuring of a specimen. More typically, at least the steps of locally removing and partially or fully restoring may be performed while the tip is provided in a charged particle column, the tip being provided in a position to perform probing or structuring of a specimen. To this end, the tip may e.g. be provided in a charged particle beam source which is installed in a charged particle column in a position to perform probing or structuring of a specimen. As a result, the method according to embodiments disclosed herein may simply be performed using standard coating devices and standard installations for application of an ultra sharp tip. This and other examples of a method of preparing an ultra-sharp emitter tip are described in European Application, Appl. No. 08159924, which has been filed on Jul. 8, 2008, entitled "Method of Preparing an Ultra Sharp Tip, Apparatus for preparing an Ultra Sharp Tip, and use of an Apparatus" which is incorporated herein by reference to the extent the applications are not inconsistent with this disclosure.

The beam-shaping means 20 includes an aperture 26. An "aperture" as referred to herein, is not to be understood as any kind of opening, like a lens mount, a part of the column housing or parts that might only theoretically delimit a beam. An aperture is to be understood as a beam shaping aperture or as a beam limiting aperture for reducing the primary ion beam intensity, or beam current. The aperture may especially be introduced in order to delimit the size of a charged particle beam, i.e. an aperture diaphragm. In light thereof, the aperture 26 opening is generally of the order of, or smaller than, a typical beam diameter, in particular smaller than 1 mm, e.g. less than 700 μm or 2 μm to 700 μm.

Figure 3:
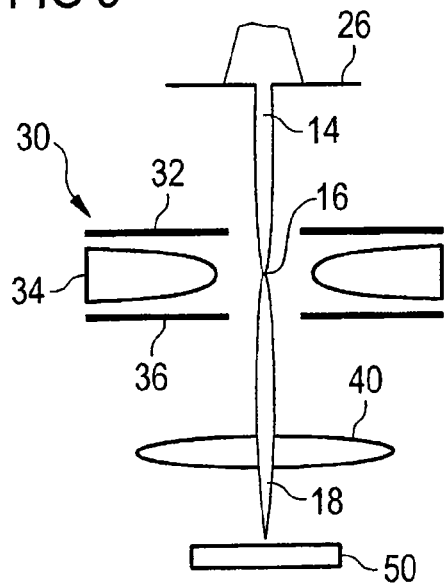
FIG. 3 shows an enlarged view of some of the parts of the embodiment shown in FIG. 1.

Further parts of the beam-shaping means 20 are not shown in detail, but generally include one or more accelerating electrodes, condenser lenses, and voltage supplies thereto. A possible arrangement of a condenser lens system upstream of the retarding lens 30 and of an additional demagnifying lens system downstream of the retarding lens 30 is described with reference to FIGS. 6 and 7 (see below), and may be provided in the embodiment of FIG. 1 as well. With condenser lenses, the ion beam 14 generally converges before the retarding lens 30, as shown in FIG. 1. Without condenser lenses, the ion beam 14 generally diverges as shown in FIG. 3.

According to yet further embodiments, which can be combined with other embodiments, the acceleration electrode or a further acceleration element like a tube on a high potential and accelerating the beam on a high potential of about 15-30 keV can be provided between the gas field ion source 12 and the retarding lens 30. Alternatively, and according to typical embodiments, which can be combined with other embodiments described herein, the retarding lens 30 can be provided between the gas field ion source and an acceleration means such that the retarding lens influences the ion beam, as described in more detail below, before the ion beam is accelerated to a high potential.

Further, the beam-shaping means 20 may include an alignment element for aligning the beam spot position. The alignment element generally includes two deflectors adapted for deflecting the ion beam. The two deflectors are, for example, adapted and controlled for deflecting the beam by respective deflecting angles that are equal in magnitude but opposite in direction, such as to offset the beam laterally. The alignment element allows the operator to align the beam 14 accurately with the center of the retarding lens 30.

Any aperture-like elements of the beam shaping means 20 are generally arranged, in beam 14 direction, before the aperture 26, which is thus generally a final aperture.

The objective lens 40 is shown schematically and is provided as known in the art. While the objective lens 40 shown can be an Einzel lens, it may also be provided e.g. as an immersion lens. It may include one or more lens stages. The objective lens 40 defines the optical axis 42 of the ion beam apparatus 1. Further, a beam scanning arrangement (not shown) may be provided before or after the objective lens 40, or within the objective lens 40.

Further, a holder for a specimen 50 is provided. The term "specimen" as referred to herein, includes semiconductor wafers, semiconductor workpieces, and other workpieces such as optical blanks, memory disks and the like. Embodiments of the invention may be applied to any workpiece on which material is deposited, which is structured, or which is to be inspected.

According to embodiments described herein, the ion beam apparatus 1 further includes an energy filter for reducing the energy width of the ion beam. According to different embodiments, different energy filters can be used. Thereby, the energy width of the ion beam emitted from the gas field ion source, even though they are generally known for their small energy width, is reduced. Typically, it can be reduced to an energy width of 0.2 to 0.7 eV, such as about 0.5 eV.

Typical energy filters include Wien filters, Omega filters, or other filter types. For example, an energy filter can include a first lens generating a crossover, the crossover having a predetermined z-position; a second lens positioned after the crossover; an element acting in a focusing and dispersive manner in one plane, wherein the center of the element acting in a focusing and dispersive manner has essentially the same predetermined z-position as the cross-over, thereby, typically the element acting in a focusing and dispersive manner can be a Wien filter element. The energy filter further includes a multipole element, which acts in the one plane and a plane essentially perpendicular thereto, wherein also the center of the multipole element has essentially the same z-position as the crossover. Further, a first charged particle selection element being positioned in beam direction before the element acting in a focusing and dispersive manner; and a second charged particle selection element being positioned in beam direction behind the element acting in a focusing and dispersive manner, wherein the second charged particle selection element is a means for selecting velocity dependently, are provided.

Further embodiments of filters, may include a first element acting in a focusing and dispersive manner in a first plane and being a first Wien filter, and having a first z-position z1; a second element acting in a focusing and dispersive manner in the first plane and being a second Wien filter, and having a second z-position z2; and a charged particle selection element with a z-position between z1 and z2; wherein a focusing element with a z-position between z1 and z2 is provided such that the charged particle selection element has substantially the same z-position as the focusing element, and wherein the charged particle selection element is adapted to be a charged particle energy dependent selection element.

According to yet further embodiments, a filter may include a first element acting in a focusing and dispersive manner, the first element acting in a focusing and dispersive manner being a first Wien filter element; a second element acting in a focusing and dispersive manner, the second element acting in a focusing and dispersive manner being a second Wien filter element; a first charged particle selection element being positioned, in beam direction, before the first element acting in a focusing and dispersive manner, wherein the first charged particle selection element is adapted to be an angle dependent charged particle selection element; and a second charged particle selection element being positioned, in beam direction, after the first element acting in a focusing and dispersive manner, wherein the second charged particle selection element is adapted to be a velocity dependent selection element, wherein the first element acting in a focusing and dispersive manner and the second element acting in a focusing and dispersive manner are built and/or connected to a control unit so that different absolute values of dispersion are realized. Thereby, a first quadrupole element being positioned such that, in operation, a field of the first quadrupole element overlaps with a field of the first element acting in a focusing and dispersive manner, wherein the first quadrupole element is adapted for at least partly compensating the focusing effect of the first Wien filter element; and a second quadrupole element being positioned such that, in operation, a field of the second quadrupole element overlaps with a field of the second element acting in a focusing and dispersive manner, wherein the second quadrupole element is adapted for at least partly compensating the focusing effect of the second Wien filter element, are provided.

Examples of such above-described energy filters including one or more Wien filter elements and/or one or more quadrupole elements are described in European Patent Application EP 1521289, European Patent Application EP 1517354, and European Patent Application EP 1517353, all of which are incorporated herein by reference to the extent the applications are not inconsistent with this disclosure According to yet further embodiments, which can be combined with other embodiments described herein, the energy filter can be provided as a retarding lens 30. The retarding lens 30 is placed at a cross-over 16 position of the primary ion beam 14. The cross-over 16 may be generated e.g. by the beam-shaping means 20 (e.g. by a condenser lens system), or by the retarding lens 30 itself, i.e. is not present when the retarding lens 30 is in an "off" state.

In the following, the function of the retarding lens 30 is described in more detail. e>0 denotes the ion charge. A retarding voltage $U_{ret}$ is supplied to the retarding lens 30, specifically to retarding lens 30 electrodes. Thereby, an electrostatic saddle potential is created for the ions passing the retarding lens, having a saddle point voltage, or potential, $U_{saddle}$ at the saddle point. The potential energy at the saddle point, $e \times U_{saddle}$, is generally somewhat below the potential energy at the retarding lens 30 electrodes, $e \times U_{saddle} = e \times U_{ret} - \Delta E_{saddle}$, where $\Delta E_{saddle} \geq 0$.

The total energy (i.e. kinetic plus potential energy) of an ion emitted from the tip is $E_{tot} = E_{km,tip} + e \times U_{tip}$, where $U_{tip}$ is the tip potential applied to the emission tip 12. Thereby, however care has to be taken that the ions are not necessarily generated directly at the tip surface but may also be generated in the vicinity of the tip. Thus, the energy may be slightly lower for some ions as not the entire voltage $U_{tip}$ is acting on the ions. When scattering and interactions are neglected, the ion can only pass the retarding lens if $E_{tot} \geq e \times U_{saddle}$. Accordingly, a threshold energy can be defined such that a desired amount of ions can pass the potential saddle.

As described above, since the Etot can be slightly smaller based on the exact generation positions the threshold energy might also be slightly smaller. Thus, saddle potential might be slightly smaller or slightly larger than the tip voltage.

Lower-energy ions cannot pass and are typically reflected, i.e. deflected by more than 90°. Thus, the retarding lens 30 acts on the primary ion beam 14 as a high-pass energy filter. Thereby, the ion beam 14 is turned into an energy-filtered ion beam 18. The above energy filtering action can be paraphrased as adjusting an energy spread of the primary ion beam 18 emerging from the retardation lens 30 by supplying a suitable retardation voltage $U_{ret}$ to the retardation lens 30.

Figure 2:
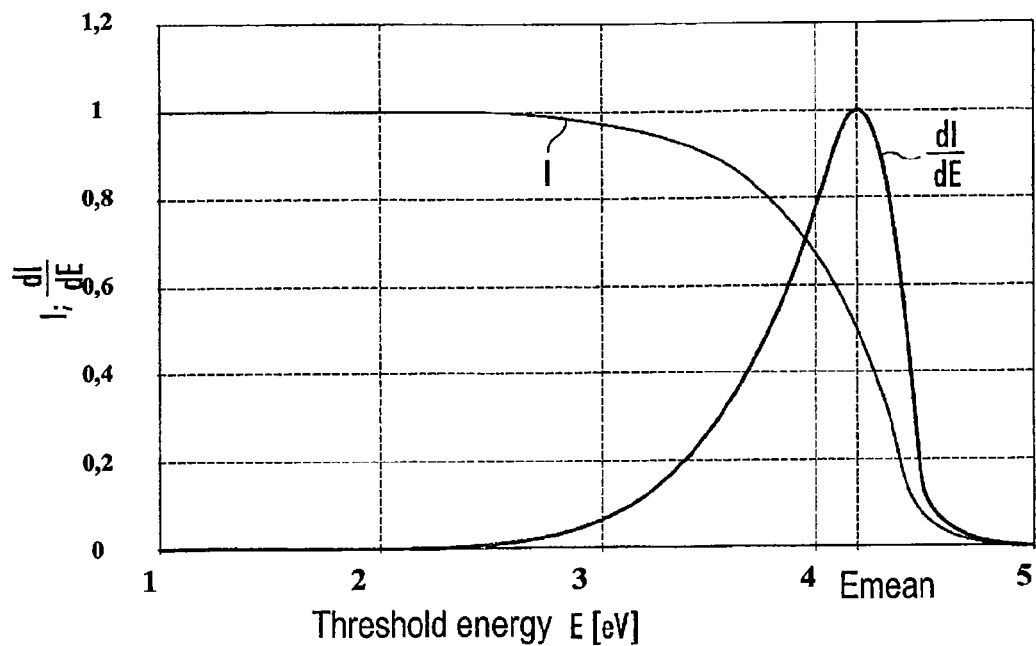
FIG. 2 is a diagram showing the beam current transmitted through the retarding lens as a function of threshold energy, and its derivative.

The effect of the high-pass energy filtering of the retarding lens 30 is better understood in connection with the graph of FIG. 2. Therein, the curve referred to as "dI/dE" represents the current density, per unit energy, of an ion beam emitted from a typical gas field ion source 12, as a function of kinetic energy $E_{kin,tip}$ at the time of emission.

The curve referred to as "I" is the total current traversing the retarding lens 30 after being high-pass energy filtered with a threshold energy $E_{th}$, as a function of the threshold energy $E_{th}$. The curve "I" thus is the integral of the beam energy distribution dI/dE from $E_{th}$ to infinity. In FIG. 2, the units of the y axis are normalized to 1.

It has been found that the energy distribution dI/dE shown in FIG. 2 is highly asymmetric, the rise of the energy distribution at the high energy side of the curve being much steeper than the corresponding rise at the low energy side. Here, an asymmetric energy distribution is defined by the energy spread on the low-energy side of the mean energy being different from, and in particular higher than, the energy spread on the high-energy side of the mean energy. The energy spread, or variance, is defined as the energy interval at the respective side of the mean energy covering a given percentage (typically 50% or 90%) of the beam intensity at that side. Gas field ion sources generally emit an ion beam having an asymmetric energy distribution.

By high-pass energy filtering a beam having an asymmetric energy distribution, a portion of the beam having relatively low intensity but relatively high energy spread may be removed. Consequently, the total energy spread of the ion beam can be reduced considerably while not overly reducing the total beam intensity.

For example, using the data shown in FIG. 2, the energy spread of the beam can be narrowed from originally about 2 eV-4 eV down to about 0.5 eV.

As stated above, the high-pass condition for ions passing the retarding lens can be described as a function of the kinetic energy of the ions. Hence, in order for the retarding lens 30 to filter the ions according to their energy $E_{kin}$ shown in FIG. 2 even when the tip voltage $U_{tip}$ varies, the saddle voltage $U_{saddle}$ should be in a predetermined relation with the tip voltage $U_{tip}$. In other words, the retarding voltage should be in a predetermined relationship with the tip voltage $U_{tip}$. In the following, the difference $U_{off} = U_{ret} - U_{tip}$ is referred to as the offset voltage $U_{off}$.

In light of the fact that ions may be generated not exactly at the tip position but may be generated in the vicinity of the emitter tip, the offset voltage can be slightly lower or slightly higher than the tip voltage, e.g., the absolute value of the offset voltage can be equal to or less than 10 V.

Returning to FIG. 1, the ion beam apparatus 1 includes a control system 60 having a first voltage supply 62 and a second voltage supply 64. The first voltage supply 62 is connected to the gas field ion source 12 for supplying the extraction voltage to the gas field ion source 12. The second voltage supply 64 is connected to the retarding lens 30 for supplying the retarding voltage to the retarding lens 30. In order for the retarding voltage to be in a predetermined relationship with the tip voltage, the second voltage supply 64 is in communication with the first voltage supply 62. Namely, the second voltage supply 64 is realized as an offset voltage supply connected to the first voltage supply 62 and to the retarding lens 30 for supplying the retarding voltage as being offset, by the supplied offset voltage, with respect to the tip voltage.

This arrangement is particularly advantageous, because compared to typical voltage differences of the order of kV even in low voltage microscopes, the offset voltage is very small, of the order of volts, if the threshold energy is to be in the region of the energy spread of the primary ion beam 14. According to some embodiments, the offset voltage is less than about 10 V, less than 3 V, and/or less than about an offset of the maximum energy of the ions emitted by the gas field ion source with respect to the extraction electrode voltage.

Typically, in the arrangement of FIG. 1, a large extraction electrode voltage of the order of kV or more is applied to the first voltage supply 62, whereas only the small offset voltage of the order of V needs to be applied to the second voltage supply 64. This arrangement allows the offset voltage to be controlled accurately without regard to further large voltages applied in the apparatus 1.

Further embodiments for the control system 60 are also possible and can be combined with other embodiments described herein. For example, the positive offset voltage difference can be applied between a pre-offset component of the control system 60 and the gas field ion source 12, and the second voltage supply is then realized by a wire connecting the pre-offset component with the retarding lens. Further, the first voltage supply 62 can be realized by an electrical connection to a fixed potential, e.g. ground potential, if other parts of the apparatus 1 are suitably biased. In this case, the offset voltage supply (e.g. supply 64) can be connected to the same potential, or to a potential having a predetermined relation with respect to that potential, whereby the second voltage supply 64 is automatically in communication with the first voltage supply 62.

Figure 5:
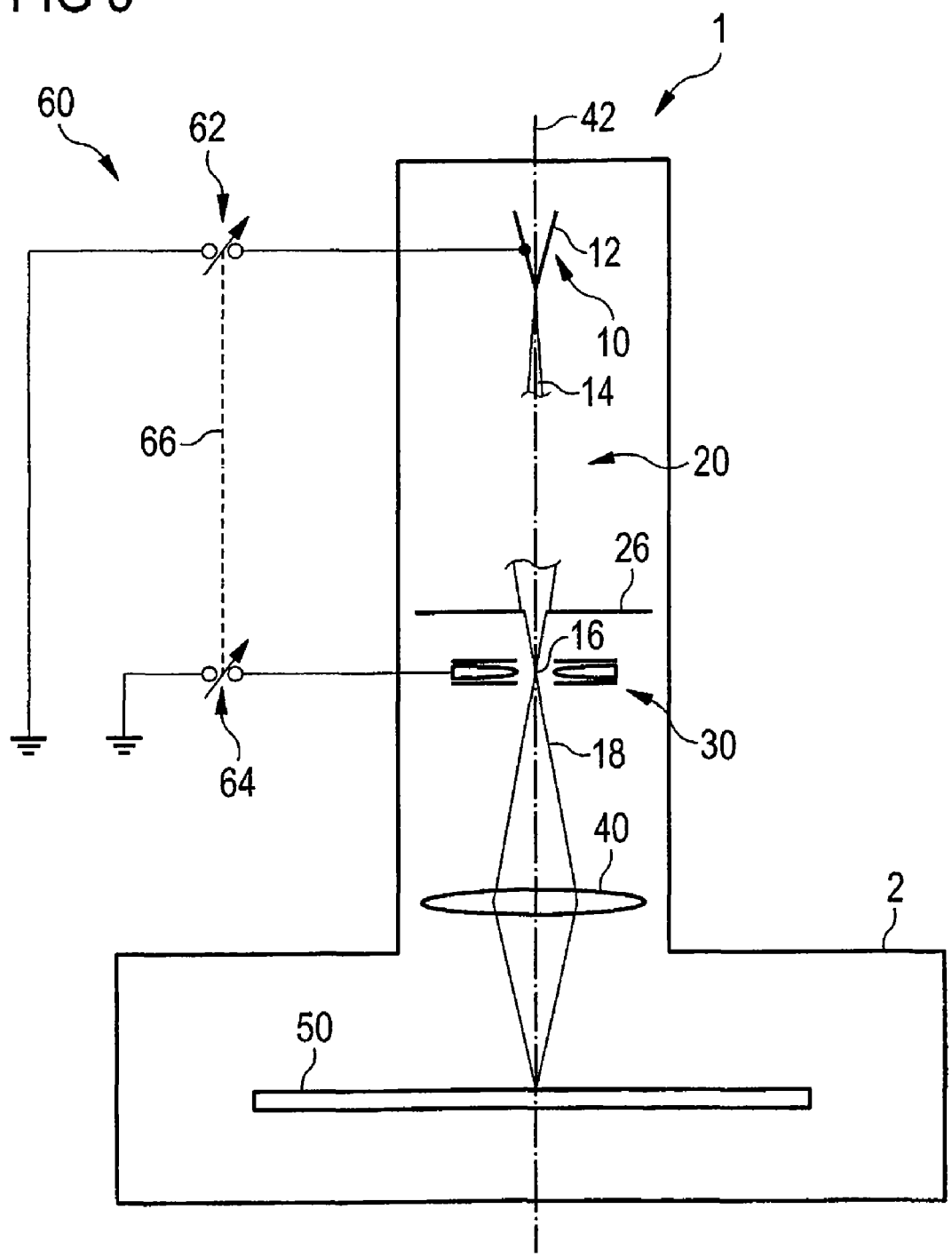
FIG. 5 shows a schematic view of a further embodiment of an ion beam apparatus.

Further, as is shown in FIG. 5, the first voltage supply 62 and the second voltage supply 64 can be realized as separate and individually tuneable voltage supplies for the gas field ion emitter 12 and the retarding lens, respectively. In FIG. 5, a voltage adjusting unit 66 is provided, which is in communication with the first voltage supply 62 and with the second voltage supply 64, and is adapted for adjusting the voltage supplied by the voltage supplies with respect to one another.

Thus, the voltage adjusting unit 66 predetermines an offset voltage and controls the first voltage supply 62 to supply a first voltage and the second voltage supply 64 to supply a second voltage, such that the voltage difference between the first and the second voltage is equal to the predetermined offset voltage.

The voltage adjusting unit 66 can be realized as a mechanic gange, i.e. a mechanic connection between the controls of the voltage supplies 62 and 64 ensuring that the respective voltages are controlled jointly, or as an ionic, e.g. digital, connection. Except for the above-described control system 60, the embodiment of FIG. 5 is analogous to that of FIG. 1.

It is to be understood that when it is stated that a voltage is supplied or applied to a unit, it is sufficient that the voltage is supplied or applied to some part of the unit, and not the entire unit, the latter being not necessarily at a constant potential.

As with any filter, the high-pass energy filtering of the retarding lens 30 is not ideal, but is somewhat blurred. An important factor contributing to the blurring is the cross-sectional extension of the primary ion beam 14, due to which not all ions experience the same saddle potential and, hence, energy threshold. In order to reduce the blurring, the retarding lens 30 is advantageously placed, as shown e.g. in FIGS. 1 and 5, at a cross-over position 16 of the primary ion beam 14. More precisely, a retarding lens 30 interaction position of the primary ion beam 14 is at the cross-over position 16. The cross-over 16 may be generated by other beam-shaping means (not shown) such as condenser lenses, or by the retarding lens 30 itself. Generally, the cross-over is such that the ions traversing the lens have a substantially symmetrical trajectory.

The retarding lens 30 may have the unwanted effect of increasing the energy and spatial spread of the primary ion beam 18 emerging from the filter due to increased ion-ion interactions at the cross-over 16, e.g. due to the Boersch effect. In order to minimize such unwanted interactions, it might be possible placing the retarding lens 30, in primary ion beam direction, after a beam limiting aperture, such as the aperture 26 shown in FIG. 1. Because in this arrangement the primary ion beam current is reduced, by the beam limiting aperture 26, before entering the retarding lens 30, the unwanted ion-ion interaction effects can be reduced significantly. In embodiments, the beam current emitted from the emitter might be in a range of less than 1 nA, 10 pA, or even 1 pA or a beam limiting aperture 26 is adapted for reducing the primary ion beam current to be less than 1 nA, 10 pA, or even 1 pA.

Further beam-shaping means such as energy or velocity filters, and/or further apertures, may be provided in addition to the elements shown in FIG. 1. The further beam shaping means may include lenses such as condenser lenses or objective lenses, beam scanning means, and other elements known in the art. The further beam shaping means may be arranged at any portion of the apparatus. Further, the apparatus 1 may include a secondary particle detecting system for secondary particles generated by the ion beam 18 impinging on the substrate 40.

Possible arrangements of elements of the apparatus 1 include the following cases, wherein the relations "before" and "after" are to be understood with respect to the primary ion beam direction: a condenser lens system and/or an accelerating electrode portion can be placed before the retarding lens 30. An objective lens 40 and/or a specimen holder for a specimen 50 can be placed after the retarding lens 30.

Figure 6:
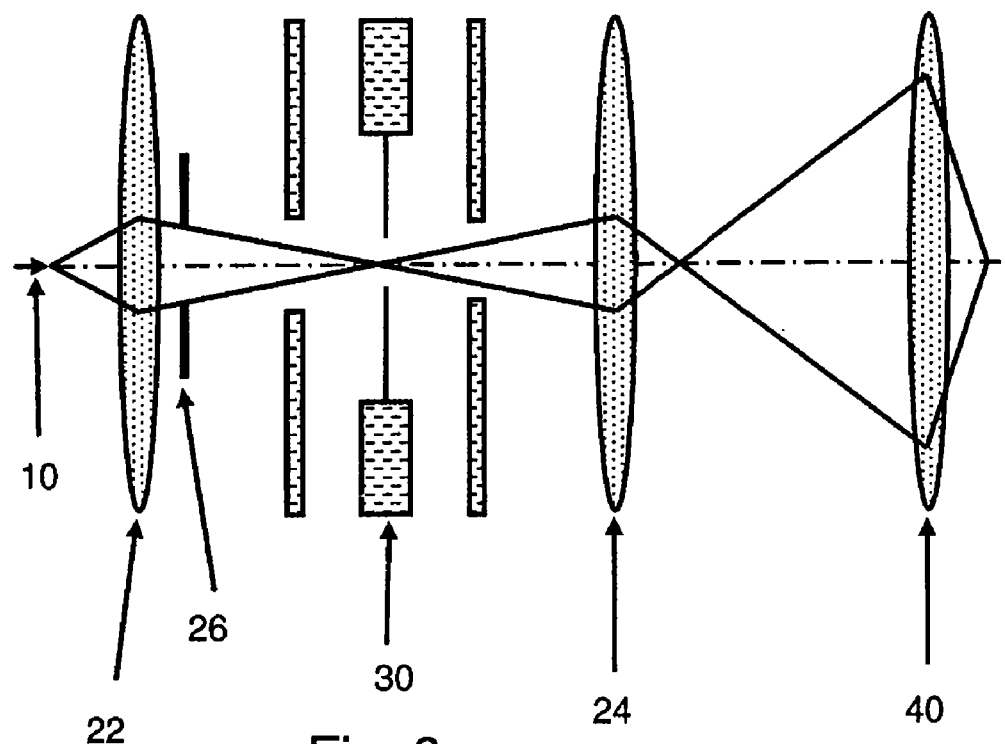
FIG. 6 shows parts of a further embodiment of an ion beam apparatus.
Figure 7:
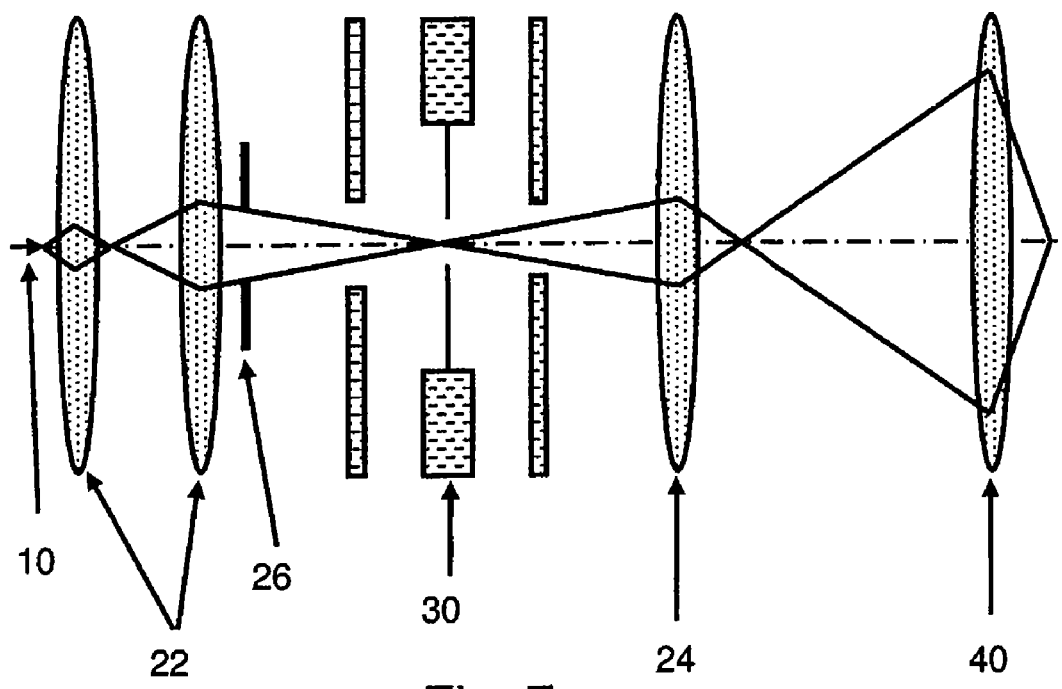
FIG. 7 shows parts of a still further embodiment of an ion beam apparatus.

With reference to FIGS. 6 and 7, particular embodiments having additional beam-shaping means are described. These embodiments have, in particular, a condenser lens system 22 placed between the ion source 10 and the aperture 26, and a demagnifying lens system 24 placed between the retarding lens 30 and the objective lens 40. Both the condenser lens system 22 and the demagnifying lens system 24 may include one, two, three or more lenses or lens stages. The lenses may be any ion lenses known in the art, e.g. electrostatic lenses. For example, in the arrangement of FIG. 6, both lens systems 22 and 24 include one lens. In the arrangement of FIG. 7, the condenser lens system 22 includes two lenses, such that an additional crossover (virtual source) can be generated between the lenses of the condenser lens system 22.

The ions are typically slowed down considerably in the retarding lens and consequently are influenced by the lens potential for a relatively long time period. Consequently, the ion beam might undergo additional aberrations within the retarding lens if not all ions are influenced in the same way. In order to reduce these aberrations, several counter-measures can be taken either individually or in combination.

One measure for reducing the aberrations is placing a beam crossover 16 in the retarding lens 30 region, preferably at the center of the retarding lens (as also shown in FIG. 1). In this case, the achievable spot size in the crossover inside the filter lens is generally in the range of below 1 nm to several nm (e.g. 0.3 nm±10 nm). In a particular embodiment, the minimum spot diameter in the crossover 16 is about 60 nm. The crossover 16 may be generated by the condenser lens system 22.

A further measure for reducing the aberrations is arranging the retarding lens such that the main beam path of the ion beam traverses the retarding lens at a central axis of the retarding lens, i.e. generally at or near a potential saddle point defined by the retarding lens 30. The alignment can be fine-tuned, if necessary, by an alignment element as described with reference to FIG. 1.

Still, there would remain a possible source of aberrations within the retarding lens due to the ions entering the lens generally at an angle from the optical axis. If the potential of the retarding lens is not perfectly isotropic with respect to a crossover-spot of the beam, ions from different angles will generally undergo a different deflection due to the lens potential. In particular, they may pick up a transversal momentum depending on the incoming angle, which would result in aberrations.

Thus, the aberrations can further be reduced by the condenser lens system 22 upstream of the retarding lens. The condenser lens provides for a magnification of the ion beam source image on the retarding lens 30, which has the effect of reducing the angular spread of the ions entering the retarding lens 30. A high magnification is achieved by e.g. placing the single condenser lens 22 of FIG. 6 sufficiently close to the ion source. For example, if $L_1$ is the distance between the (possibly virtual) ion source and the (middle of the) retarding lens 30, the lens 22 may be placed at a distance of less than $0.5 \times L_1$ from the ion source, and preferably at less than $0.3 \times L_1$ therefrom. Correspondingly, the demagnification lens 24 may be placed at a distance of less than $0.3 \times L_2$, preferably less than $0.1 \times L_2$ from the specimen plane, $L_2$ being the distance between the retarding lens 30 and the specimen plane. Thereby, the demagnification lens provides for a demagnification of the retarding lens 30 image on the specimen, thus at least partially compensating a magnification effect of the condenser lens 22.

As an additional consideration, the magnification and the demagnification of the lens systems 22 and 24 are advantageously adapted to the spot diameter, such as to minimize the loss of beam intensity. Thus, the condenser lens system 22 can be adapted to achieve a magnification between the ion source and the crossover 16 (or the retarding lens 30) in the range of 2-100, depending on the, possibly virtual, beam source size. For a gas field ion source 12, the magnification is typically about 5-40 times, e.g. 10 times. The demagnification is of the demagnification lens system 24 between the retarding lens and a specimen plane is generally in the range of 1-50, typically about 3-30 times, e.g. 10 times.

A further measure for reducing aberrations is adapting the retarding lens for providing a potential with a high degree of isotropy (see below).

In alternative embodiments, a stigmatic cross-over 16 may be avoided, e.g. by providing an extended image of the ion beam source at the position of the retarding lens 30. Preferably, the image is astigmatic. In these embodiments, instead of being focused onto a cross-over spot 16, the ions may traverse the retarding lens 30 in an extended lateral region, e.g. a line- or oval-shaped lateral region.

To this purpose, any of the embodiments disclosed herein can be adapted as follows: An additional cylinder lens is placed, as an astigmatic lens, in primary beam direction before the retarding lens 30, in order to provide the astigmatic image. The retarding lens 30 may also be provided as a cylinder lens in order to provide a retarding potential that is adapted to the astigmatic beam shape. A further cylinder lens is placed, as an astigmatic lens, after the retarding lens 30, in order to compensate for the astigmatism of the preceding astigmatic lenses, and to make the beam stigmatic again.

Alternatively, instead of providing separate astigmatic lenses, lenses or beam-shaping means that are already present can be modified to provide for the astigmatic properties. Further, other lens aberrations may be used in order to provide an extended image of the ion beam source at the position of the retarding lens 30, e.g. chromatic aberrations.

In the following, the retarding lens 30 is described in more detail in connection with FIG. 3. The retarding lens is an electrostatic lens or has at least an electrostatic lens component. The retarding lens 30 of FIG. 3 includes three electrodes 32, 34, 36. The above-mentioned retarding potential is typically applied to the middle electrode 34, whereas the further electrodes 32 and 36 are supplied for screening the field of the middle electrode 34, and for assisting the retardation action, i.e. an intermediate deceleration followed by an intermediate acceleration action, of the retarding lens 30. The electrodes of the retarding lens 30 may have a distance of, for example, 10 mm, 15 mm or 20 mm, but this distance may vary depending on the overall design. The electrodes may be controlled such that the outgoing high-pass filtered beam is not substantially accelerated or decelerated with respect to the incoming beam, but may alternatively be controlled for providing a net acceleration or deceleration. Depending on the details of the desired accelerating, decelerating, and/or retarding action of the lens, more electrodes than three may be provided.

In order to provide a retarding lens potential with a high degree of isotropy, an electrostatic lens with small spherical aberration, e.g. an Einzel lens, is preferred. In particular, the retarding voltage may be applied axially symmetrically around the optical axis. However, it is also possible to apply the voltage asymmetrically. Further, the retarding lens is preferably a hyperbolic lens, i.e. the lens electrodes are arranged for producing a saddle point electrostatic potential field.

The retarding lens 30 electrodes have a central opening at the optical axis 12 for the ion beam 14.

The voltage supply for the retarding lens 30 is operable to turn the retarding lens 30 to an "off" state, i.e. to turn off a filtering action of the retarding lens. This is achieved by applying a predetermined voltage to the retarding lens, and preferably by supplying the same potential to all electrodes. The predetermined voltage is of the order of the voltage of other nearby elements, e.g. of the aperture 26, and may be ground voltage. The "off" state allows for a high current and low resolution mode.

Figure 4:
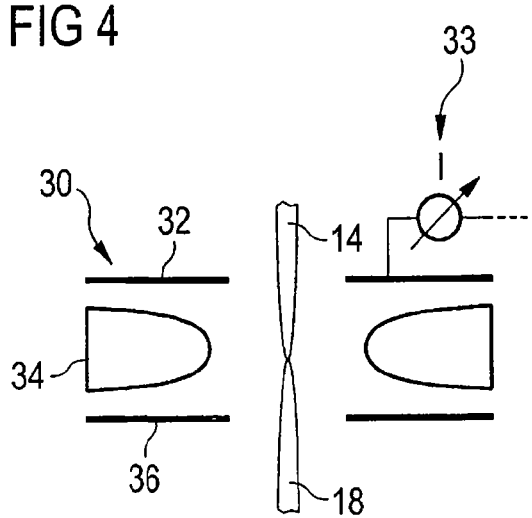
FIG. 4 shows an enlarged view of the parts of a further embodiment of an ion beam apparatus.

FIG. 4 shows an enlarged view of the parts of a further embodiment of a an ion beam apparatus. Therein, a current detector 33 is attached to the first electrode 32 of the retarding lens 30. The electrode 32 acts as a collector 32 for collecting ions that have been reflected by the retarding lens 30. Alternatively, the collector can be provided as a separate unit (not shown). The collector is generally arranged, in primary ion beam direction, before the retarding lens 30 or at least before a retarding electrode 34 of the retarding lens 30.

The current detector 33 allows measuring ions that are reflected by the retarding lens 30, in particular a current generated by the ions. The signal from the measured ions allows deducing information about the energy distribution and the energy spread of the filtered and unfiltered ion beam.

An alternative collector/detector combination may be provided, e.g. by any other ion detecting device such as a scintillation detector or a Faraday detector. Further, only a collector may be provided for removing the reflected ions, without a detector.

While the current detector 33 of FIG. 4 is provided within the retarding lens 30, this need not be the case. In alternative embodiments, a detector for the reflected ions may be provided e.g. in primary beam direction before the retarding lens 30. The reflected ions tend to be approximately back-reflected, i.e. to follow the primary ion beam 14 trajectory in reverse direction. Therefore, it is advantageous to include a beam separation element for separating the reflected ions from the primary beam 14 ions before the retarding lens 30. The beam separation means may be realized by a Wien filter or by some other velocity-dependent deflection element (e.g. multiple magnetic deflectors). The reflected-ion detector may then be positioned, in reflected-beam direction, after the beam separation means.

Alternatively or in addition to the reflected current detector, a detector for the beam portion transmitted through the retarding lens may be provided. The detector may be any primary beam detector known from other charged-particle beam devices.

The advantages of the retarding lens 30 is that it provides an energy filter that is efficient, easy to realize, low in cost, and that allows for a small energy spread while not overly reducing the current.

In light of the above, a plurality of embodiments can be provided. According to one embodiment, a method for providing an energy-filtered primary ion beam is provided. The method includes generating a primary ion beam having an asymmetric first energy distribution by means of a gas field ion source; and energy filtering the primary ion beam for reducing the energy width of the primary ion beam. According to yet further embodiments, which can be combined with the above embodiments, the energy filtering includes high-pass energy filtering the primary ion beam; and/or the high-pass energy filtering uses a retarding lens. Further embodiments, which can be combined with any of the embodiments described herein, may further include predetermining an offset voltage, applying a first voltage to an ion emitter of the gas field ion source, and applying a second voltage to the retarding lens, wherein the first voltage and the second voltage are controlled to have a voltage difference equal to the predetermined offset voltage; may be yielded by the second voltage not substantially exceeding the first voltage; by the absolute value of the offset voltage being equal or less than 10 V; and/or may further include generating the second voltage by adding the predetermined offset voltage to the first voltage. According to yet further embodiments, which can be combined with any of the above embodiments, the method may further include collecting ions that are reflected by the retarding lens; generating a cross-over of the primary ion beam at a retarding lens interaction position of the primary ion beam; and/or transmitting the primary ion beam through a condenser lens system for magnifying the primary ion beam, a condenser lens of the condenser lens system being placed at a distance of less than $0.5 \times L1$ from the ion source, L1 being a distance between the ion source and the retarding lens, and e.g. transmitting the primary ion beam through a demagnifying lens system for demagnifying the primary ion beam, a demagnifying lens of the demagnifying lens system being placed at a distance of less than $0.3 \times L2$ from a specimen plane, L2 being the distance between the retarding lens and the specimen plane.

According to yet another embodiment, an ion beam apparatus is provided. The ion beam apparatus includes a gas field ion source for providing a primary ion beam, and an energy filter adapted for reducing the energy width of the primary ion beam. According to a yet further embodiment, additionally, the gas field ion source can include an emitter tip having a superimposed tip, particularly a superimposed ultra-sharp tip. According to yet further implementations, alternatively or additionally, the energy filter can be a retarding lens adapted to be a high-pass energy filter for the primary ion beam and further includes a first voltage supply for supplying a first voltage to the gas field ion source, and a second voltage supply connected to the retarding lens for supplying a second voltage to the retarding lens, the second voltage supply being in communication with the first voltage supply; such that as an example the second voltage does not substantially exceed the first voltage and/or the absolute value of the difference between the second voltage and the first voltage is less than about 10 V. According to yet further embodiments, which can be combined with other embodiments described herein, thereby, the second voltage supply may include an offset voltage supply connected to the first voltage supply and to the retarding lens for supplying the second voltage as being offset, by the offset voltage, with respect to the first voltage; and/or the apparatus may include a voltage adjusting unit in communication with the first voltage supply and with the second voltage supply, the voltage adjusting unit being adapted for adjusting the first voltage and the second voltage with respect to one another. According to yet further embodiments, alternatively or additionally, the apparatus may further include a condenser lens system for the primary ion beam, wherein the retarding lens is placed, in primary ion beam direction, after the condenser lens system, e.g., such that a condenser lens of the condenser lens system is placed at a distance of less than 0.5×L1 from the ion source, L1 being the distance between the ion source and the retarding lens, and typically wherein a demagnifying lens of a demagnifying lens system can be placed at a distance of less than 0.3×L2 from a specimen plane, L2 being the distance between the retarding lens 30 and the specimen plane.

According to yet further embodiments, which can be combined with other embodiments described herein, the apparatus may include an objective lens for the primary ion beam placed, in primary ion beam direction, after the retarding lens; the retarding lens can be adapted for reflecting ions of the primary ion beam having a substantially lower energy than a predetermined threshold energy; the retarding lens can include at least three electrodes; the apparatus may further include a collector for collecting ions that are reflected by the retarding lens; the retarding lens can be placed at a cross-over position of the primary ion beam; and/or the apparatus can be a scanning ion microscope.

The embodiments described herein thereby allow for an energy filter ion beam emitted from a gas field ion source, which in spite of the common view to be known for its good energy width characteristics, can surprisingly show an energy width that might need to be improved.

While the foregoing is directed to embodiments of the invention, other and further embodiments of the invention may be devised without departing from the basic scope thereof. For example, the present invention can be applied for apparatuses and components using, instead of ions, other sources of charged particles, e.g. ions.

The invention claimed is:

1. A method for providing an energy-filtered primary ion beam in a scanning ion microscope on a specimen, the method comprising:
generating a primary ion beam having an asymmetric first energy distribution by means of a gas field ion source; and
energy filtering the primary ion beam for reducing the energy width of the primary ion beam, wherein the energy filtering includes high-pass energy filtering the primary ion beam.

2. The method according to claim 1, wherein the high-pass energy filtering uses a retarding lens.

3. The method according to claim 2, further comprising:
predetermining an offset voltage;
applying a first voltage to an ion emitter of the gas field ion source; and
applying a second voltage to the retarding lens, wherein the first voltage and the second voltage are controlled to have a voltage difference equal to the predetermined offset voltage.

4. The method according to claim 3, wherein the second voltage does not substantially exceed the first voltage.

5. The method according to claim 4, wherein the absolute value of the offset voltage is equal to or less than 10 V.

6. The method according to claim 3, further comprising generating the second voltage by adding the predetermined offset voltage to the first voltage.

7. The method according to claim 2, further comprising:
collecting ions that are reflected by the retarding lens.

8. The method according to claim 2, further comprising:
generating a cross-over of the primary ion beam at a retarding lens interaction position of the primary ion beam.

9. The method according to claim 2, further comprising:
transmitting the primary ion beam through a condenser lens system for magnifying the primary ion beam, a condenser lens of the condenser lens system being placed at a distance of less than $0.5 \times L_1$ from the ion source, $L_1$ being a distance between the ion source and the retarding lens; and
transmitting the primary ion beam through a demagnifying lens system for demagnifying the primary ion beam, a demagnifying lens of the demagnifying lens system being placed at a distance of less than $0.3 \times L_2$ from a specimen plane, $L_2$ being the distance between the retarding lens and the specimen plane.

10. An ion beam apparatus, comprising:
a gas field ion source for providing a primary ion beam having an asymmetric first energy distribution;
a beam scanning arrangement; and
a high-pass energy filter adapted for reducing the energy width of the primary ion beam.

11. The ion beam apparatus according to claim 10, wherein the gas field ion source comprising an emitter tip having a super imposed tip.

12. The ion beam apparatus of claim 10, further comprising a condenser lens system for the primary ion beam, wherein the energy filter is placed, in primary ion beam direction, after the condenser lens system.

13. The ion beam apparatus of claim 10, further comprising an objective lens for the primary ion beam placed, in primary ion beam direction, after the energy filter.

14. The ion beam apparatus of claim 11, wherein the super imposed tip is a super imposed ultra-sharp tip.

15. An ion beam apparatus, comprising:
a gas field ion source for providing a primary ion beam; and
an energy filter comprising a retarding lens adapted to be a high-pass energy filter for the primary ion beam, the energy filter further comprising:
a first voltage supply for supplying a first voltage to the gas field ion source; and
a second voltage supply connected to the retarding lens for supplying a second voltage to the retarding lens, the second voltage supply being in communication with the first voltage supply.

16. The ion beam apparatus of claim 15, wherein the second voltage does not substantially exceed the first voltage.

17. The ion beam apparatus of claim 16, wherein the absolute value of the difference between the second voltage and the first voltage is less than about 10 V.

18. The ion beam apparatus of claim 15, wherein the second voltage supply comprises an offset voltage supply connected to the first voltage supply and to the retarding lens for supplying the second voltage as being offset, by the offset voltage, with respect to the first voltage.

19. The ion beam apparatus of claim 15, further comprising a voltage adjusting unit in communication with the first voltage supply and with the second voltage supply, the voltage adjusting unit being adapted for adjusting the first voltage and the second voltage with respect to one another.

20. The ion beam apparatus of claim 15, further comprising:
   a condenser lens of a condenser lens system placed at a distance of less than 0.5×L1 from the ion source, L1 being the distance between the ion source and the retarding lens; and
   a demagnifying lens of a demagnifying lens system placed at a distance of less than $0.3 \times L_2$ from a specimen plane, $L_2$ being the distance between the retarding lens 30 and the specimen plane.

21. The ion beam apparatus of claim 15, wherein the retarding lens is adapted for reflecting ions of the primary ion beam having a substantially lower energy than a predetermined threshold energy.

22. The ion beam apparatus of claim 15, wherein the retarding lens comprises at least three electrodes.

23. The ion beam apparatus of claim 15, comprising a collector for collecting ions that are reflected by the retarding lens.

24. The ion beam apparatus of claim 15, wherein the retarding lens is placed at a cross-over position of the primary ion beam.

25. The ion beam apparatus of claim 15, wherein the ion beam apparatus is a scanning ion microscope.

* * * * *